US005475761A

United States Patent [19]

Eatwell

[11] Patent Number: 5,475,761

[45] Date of Patent: Dec. 12, 1995

[54] ADAPTIVE FEEDFORWARD AND FEEDBACK CONTROL SYSTEM

[75] Inventor: Graham P. Eatwell, Caldecote, United Kingdom

[73] Assignee: Noise Cancellation Technologies, Inc., Linthicum, Md.

[21] Appl. No.: 188,869

[22] Filed: Jan. 31, 1994

[51] Int. Cl.[6] .................... H03B 29/00

[52] U.S. Cl. .................... 381/71; 381/94

[58] Field of Search .................... 381/71, 94

[56] References Cited

U.S. PATENT DOCUMENTS

| | | | |
|---|---|---|---|
| 2,043,416 | 6/1936 | Lueg | 179/1 |
| 4,122,303 | 10/1978 | Chaplin et al. | 179/1 P |
| 4,536,887 | 8/1985 | Kaneda et al. | 381/94 |
| 4,769,847 | 9/1988 | Taguchi | 381/94 |
| 4,878,188 | 10/1989 | Ziegler | 364/724.01 |
| 5,146,505 | 9/1992 | Pfaff et al. | 381/71 |
| 5,295,192 | 3/1994 | Hamada et al. | 381/71 |
| 5,377,276 | 12/1994 | Terai et al. | 381/94 |

OTHER PUBLICATIONS

Nelson & Elliott, "Active Control of Sound", Academic Press, 1992, pp. 195–199 and pp. 379–410.

Doelman, N. J., "A Unified Control Strategy for the Active Reduction of Sound and Vibration", Journal of Intelligent Material Systems and Structures, Oct. 1991, vol. 2, No. 4, pp. 558–580.

Morgan, D. R., "An Analysis of Multiple Correlation Cancellation Loops with a Filter in the Auxialiary Path", IEEE Transactions on Acoustics, Speech and Signal Processing, Aug. 1980, vol. ASSF–28, No. 4, pp. 454–467.

Widrow & Stearns, "Adaptive Signal Processing", Prentice–Hall, 1985.

*Primary Examiner*—Stephen Brinich

[57] ABSTRACT

An active control system for multiple interacting channels to control a constant noise or vibration consisting of first and second sensor means adapted to provide reference and residual signals respectively, a first and second filter means and first and second subtraction means to provide first and second output control signals and means for combining said output signals.

25 Claims, 4 Drawing Sheets

ADAPTIVE FEEDFORWARD AND FEEDBACK CONTROL SYSTEM

BACKGROUND

Active control of disturbances, such as sound, vibration or disturbances in signals is well known. A recent review of the field is contained in 'Active Sound Control' by P. A. Nelson and S. J. Elliot, Academic Press, 1991. Such systems use an actuator to generate a control disturbance which is out of phase with the original disturbance and so tends to cancel it. This technique is first described by Lueg in U.S. Pat. No. 2,043,416. Most active control systems use adaptive filtering techniques, in which the controller characteristic is adjusted according to an algorithm such as the 'filtered-x LMS algorithm' such as disclosed by D. R. Morgan, IEEE Transactions on Acoustics, Speech and Signal Processing, Volume ASSF 28, Number 4, 1980, and by Widrow and Stearns, 'Adaptive Signal Processing', Prentice Hall, 1985. Two widely used techniques are feedforward control, as described in Chaplin U.S. Pat. No. 4,122,303, and feedback control as described in Ziegler U.S. Pat. No. 4,878,188.

In an active control system, the reference sensor is usually sensitive to the control disturbance. This provides a feedback mechanism which can cause the system to become unstable. One known method for compensating for this is to estimate the feedback component and to subtract it from the sensor signal. Both Chaplin and Ziegler use this compensation technique.

The adaptive feedforward controller disclosed in Chaplin is shown in FIG. 1. In this configuration the control system is used for canceling noise (1) propagating down a pipe or duct (2). An upstream (relative to the direction of sound propagation) or reference sensor (3) provides a reference signal (4) related to the sound at the sensor position. This signal is input to the control system (5) which in turn generates a control signal (6). The control signal is supplied to actuator (7) which in turn produces sound to cancel the original noise. An error or residual sensor (8), downstream of the actuator, produces a residual signal (9) related to the residual sound at that position. This signal is used to adjust the characteristic of the control system (5). The control system comprises a compensation filter (10) which acts on the control signal (6) to produce a compensation signal (11) which is an estimate of the component of signal (4) due to the actuator. Hence the characteristic of the filter should correspond to the impulse response of the physical system from controller output to controller input (including the response of the actuator (7), the sensor (3) and, for digital systems, any anti-aliasing filter or anti-imaging filter). The compensation signal (11) is subtracted at (12) from the reference signal (4) to produce an input signal (13). The input signal is then passed through a cancellation filter (14) to produce the control signal (6). The filtered-x LMS algorithm is commonly used to adjust the characteristic of the cancellation filter (14). The characteristic of compensation filter (10) can be determined by known system identification techniques.

The adaptive feedback controller disclosed by Ziegler is shown in FIG. 2. In this configuration the control system is used for canceling noise (1) propagating down a pipe or duct (2). A sensor (8), downstream of the actuator (relative to the direction of sound propagation), provides a signal (9) related to the sound at the sensor position. This signal is input to the control system (15) which in turn generates a control signal (6)° The control signal is supplied to actuator (7) which in turn produces sound to cancel the original noise. The same sensor (8) acts as a residual sensor since the signal (9) is related to the residual sound at that position. This signal is used to adjust the characteristic of the control system (15). The control system comprises a compensation filter (16) which acts on the control signal (6) to produce a compensation signal (17) which is an estimate of the component of signal (9) due to the actuator. Hence the characteristic of the filter should correspond to the impulse response of the physical system from controller output to controller input (including the response of the actuator (7), the sensor (8) and, for digital systems, any anti-aliasing filter or anti-imaging filter). The compensation signal (17) is subtracted at (18) from the residual signal (9) to produce an input signal (19). The input signal is then passed through a cancellation filter (20) to produce the control signal (6). The filtered-x LMS algorithm is commonly used to adjust the characteristic of the cancellation filter (20).

The performance of a feedforward control system is limited by noise at the reference sensor which is uncorrelated with the disturbance. This is called the 'coherence limit'. The performance of a feedback control system is limited by the delay in the control loop, which limits performance to narrow-band or low frequency disturbances. Hence for disturbances which are a mixture of broadband and narrow band noise there is an advantage to be gained by using a combination of feedforward and feedback control.

This has been recognized by N. J. Doelman, 'A Unified Strategy for the Active Reduction of Sound and Vibration', Journal of Intelligent Materials Systems and Structures, Volume 2, Number 4 October 1991, pp. 558–580. This system is shown in FIG. 3 (also Doelman's FIG. 3). The outputs of a feedforward filter (5) and a feedback filter (15) are combined at (21) to produce the control signal (6). Doelman uses recursive filters and derives the optimal filter characteristics for stationary noise signals. However, there is no interaction between the two filters (5) and (15) in his arrangement. This can have serious implications since there is no guarantee that the filters he derives are stable. For an 'off-line' design process the stability of the filters (both in open-loop and in closed loop) can be checked before the filter is implemented, but for adaptive control systems it is not practical to continually check for system stability. The risk of instability in the system would make this system unsuitable for practical implementation.

There is, therefore, a need for an adaptive control system which can be adapted easily without the risk of instability.

SUMMARY OF THE INVENTION

The current invention relates to a combined feedback and feedforward system for controlling disturbances. The system uses compensation filters to ensure the closed loop stability of the system and provides a computationally efficient way for adapting such a system while maintaining stability.

An object of the invention is to provide a system which can be adapted without any instability.

This and other objects of the invention will become apparent when reference is had to the accompanying drawings in which:

LIST OF FIGURES

DETAILED DESCRIPTION OF THE INVENTION

Figure 1:
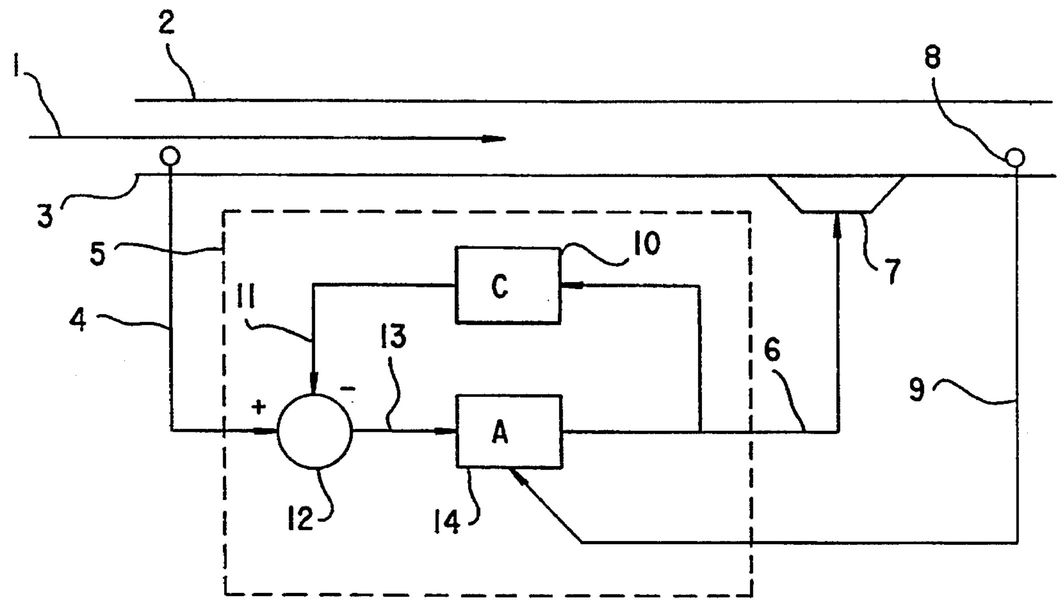
Fig.1 PRIOR ART
FIG. 1 is a diagrammatic view of a known adaptive feedforward control system.

The invention relates to a system for controlling a vibration or noise disturbance. For example, the disturbance may be sound propagating down a pipe duct, or propagating in an open region, or it may be vibration propagating through a structure. The system is a combined feedforward and feedback control system which utilizes compensation filters to ensure stability of the system.

A reference sensor is used to provide a reference signal (uf) related at least in part to the disturbance to be controlled and a residual sensor is used to provide a residual signal (ub) related to the controlled disturbance. A reference compensation signal (Cy) is subtracted from the reference signal to produce a feedforward input signal (xf). The feedforward input signal is filtered by a feedforward cancellation filter (A) to produce a Feedforward output signal (yf). A residual compensation signal (Dy) is subtracted from the residual signal to produce a feedback input signal (xb). The feedback input signal is filtered by a feedback cancellation filter (B) to produce a feedback output signal (yb).

The feedforward and feedback output signals are then combined to produce a control signal (y) which is sent to an actuator. The actuator produces a control disturbance which modifies the original disturbance. Usually, but not always, the intention is that the residual disturbance is smaller than the original disturbance.

In the general implementation the cancellation filters are recursive filters, in the simplest implementation they are Finite Impulse Response(FIR) filters. In this case the operation at the $n^{th}$ time step is described by the equations $$xf(n) = uf(n) - Cy(n) \quad (1)$$

$$xb(n) = ub(n) - Dy(n) \quad (2)$$

$$yf(n) = \sum_{m=0}^{nA-1} A(m) \cdot xf(n-m) \quad (3)$$

$$yb(n) = \sum_{m=0}^{nB-1} B(m) \cdot xb(n-m) \quad (4)$$

$$y(n) = yf(n) + yb(n) \quad (5)$$

where nA is the number of coefficients in the feedforward cancellation filter and nB is the number of coefficients in the feedback cancellation filter. The reference compensation signal is derived from the combined output using $$Cy(n+1) = \sum_{m=0}^{nC-1} C(m) \cdot y(n-m) \quad (6)$$

where the filter C is the reference compensation filter which models the physical feedback from the controller output to the controller reference input, including the response of the actuator, the sensor and any filters. nC is the number of coefficients in this filter. This is in contrast to the scheme of Doelman in which the combined output is not used in the filters.

The residual compensation signal can be derived in one of two methods. Firstly, it can be derived from the combined output using $$Dy(n+1) = \sum_{m=0}^{nD-1} D(m) \cdot y(n-m) \quad (7)$$

where the filter D is the residual compensation filter which models the physical feedback from the controller output to the controller residual input, including the response of the actuator, the sensor and any filters. nD is the number of coefficients in this filter.

Alternatively, the residual compensation signal can be derived from the output of the feedback cancellation filter, so that $$Dy(n+1) = \sum_{m=0}^{nD-1} D(m) \cdot yb(n-m) \quad (8)$$

The characteristics of the filters C and D (which may be recursive filters or FIR filters) can be found by standard system identification techniques or by on-line system identification. In the latter case a low level test signal is added to the output control signal and the difference between the actual response and the predicted response is used to adjust the filter characteristics. The LMS algorithm, for example, can be used for this adaption.

The feedback cancellation filter B can be adapted by the filtered-x input algorithm for example. This is the simplest algorithm but many alternative adaption algorithms have been disclosed. The coefficients are updated using $$Dxb(n) = \sum_{m=0}^{nD-1} D(m) \cdot xb(n-m) \quad (9)$$

$$B_n(m) = (1 - \mu_B\lambda_B) \cdot B_{n-1}(m) - \mu_B \cdot rb(n) \cdot Dxb(n-m), \quad m = 0, nB-1 \quad (10)$$

where $\mu_B$ is the adaption step size and $\lambda_B$ is a leakage parameter. The feedforward filter may also be adapted using the filtered-x LMS algorithm. The filtered-input signal is given by $$Dxf(n) = \sum_{m=0}^{nD-1} D(m) \cdot xf(n-m) \quad (11)$$

Figure 2:
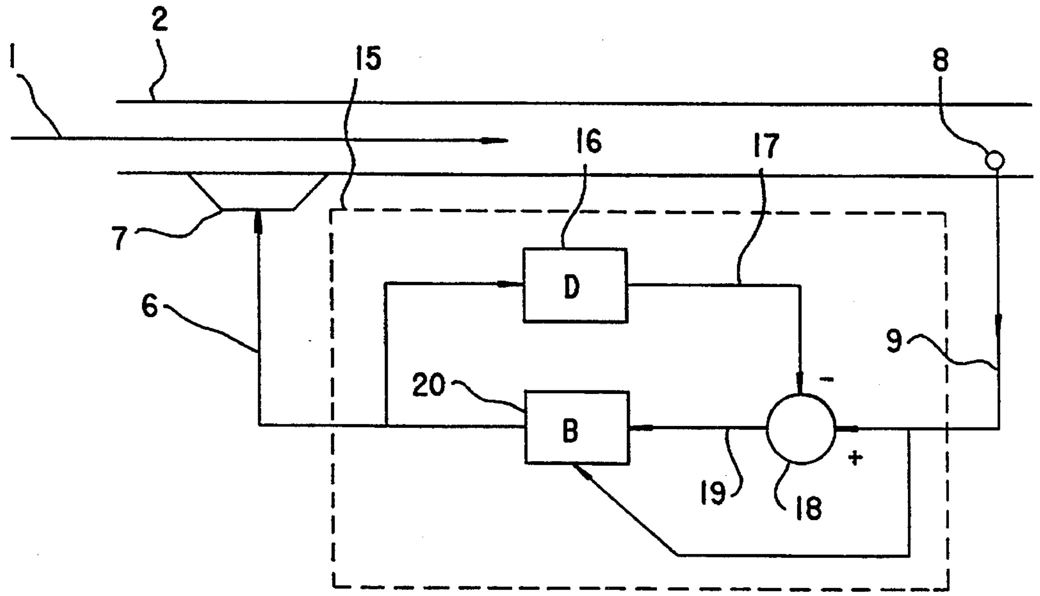
Fig.2 PRIOR ART
FIG. 2 is a diagrammatic view of a known adaptive feedback control system.
Figure 3:
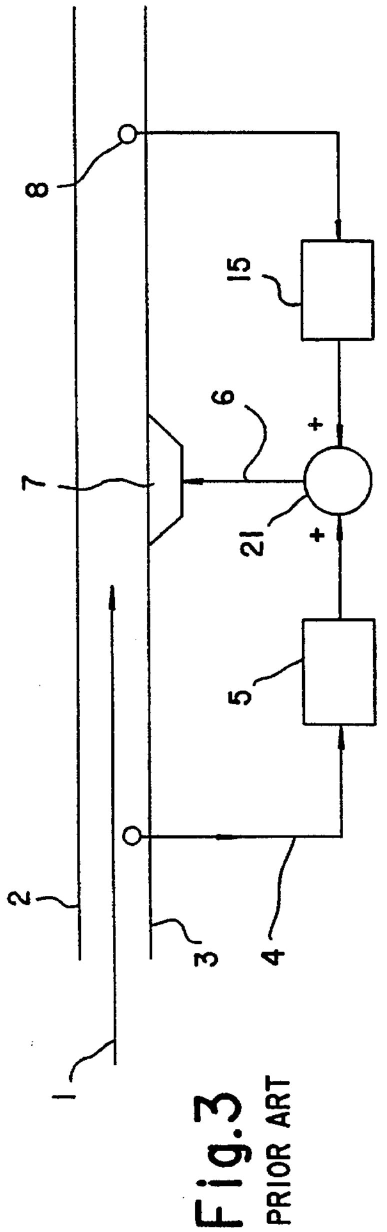
Fig.3 PRIOR ART
FIG. 3 is a diagrammatic view of a known combined feedforward and feedback control system.
Figure 4:
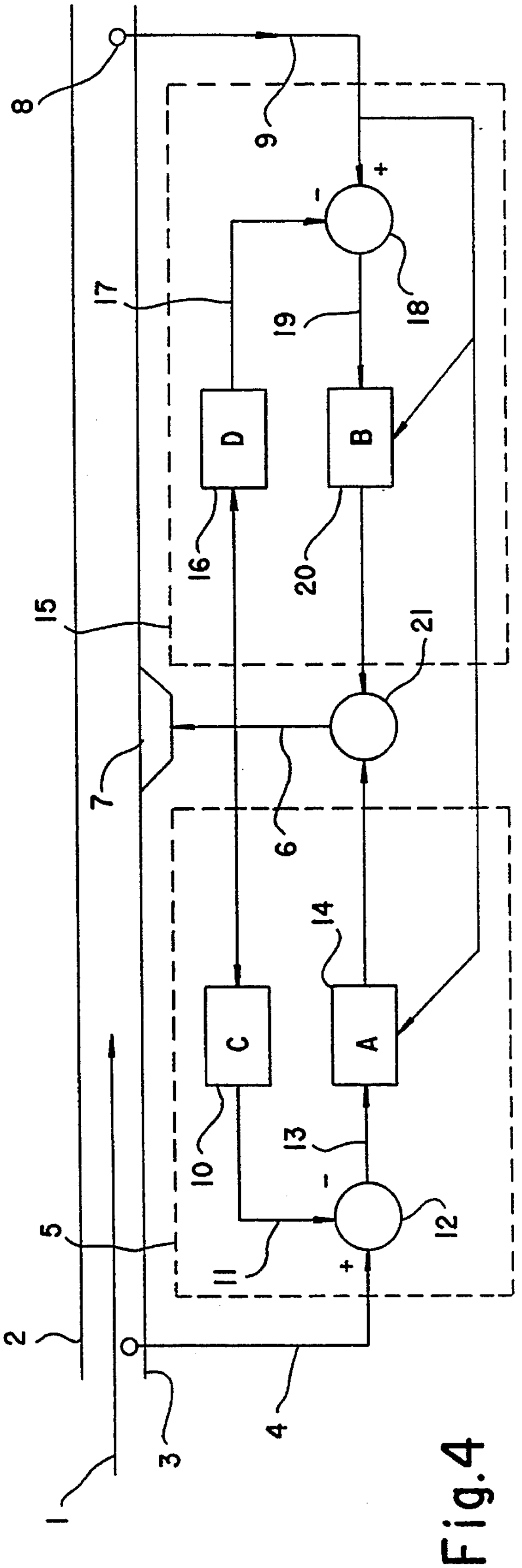
FIG. 4 is a diagrammatic view of a combined feedforward and feedback control system of the invention.

The feedforward cancellation coefficients can be updated using the residual signal, rb, according to $$A_n(m)=(1-\mu_A\lambda_A).A_{n-1}(m)-\mu_A.rb(n).Dxf(n-m), m=0, nA-1 \quad (12)$$

where $\mu_A$ is the adaption step size and $\lambda_A$ is a leakage parameter. This is depicted in FIG. 4. FIG. 4 is a combination of FIGS. 1 and 2, except the outputs from the feedforward filter (14) and the feedback filter (20) are combined at (21) to produce the output control signal (6), and the compensation signals (11) and (17) are obtained by filtering the combined output control signal (6) rather than the individual output signals. Both of the filters (14) and (20) are adjusted in response to the residual signal (9). In most adaption algorithms, such as the filtered-x LMS algorithm described above, the input to the cancellation filters is also used in the update calculation.

An alternative to equation (12) is to adapt the feedforward cancellation coefficients using the feedback input signal, xb, according to $$A_n(m)=(1-\mu_A\lambda_A).A_{n-1}(m)-\mu_A xb(n).Dxf(n-m), m=0, nA-1 \quad (13)$$

Figure 5:
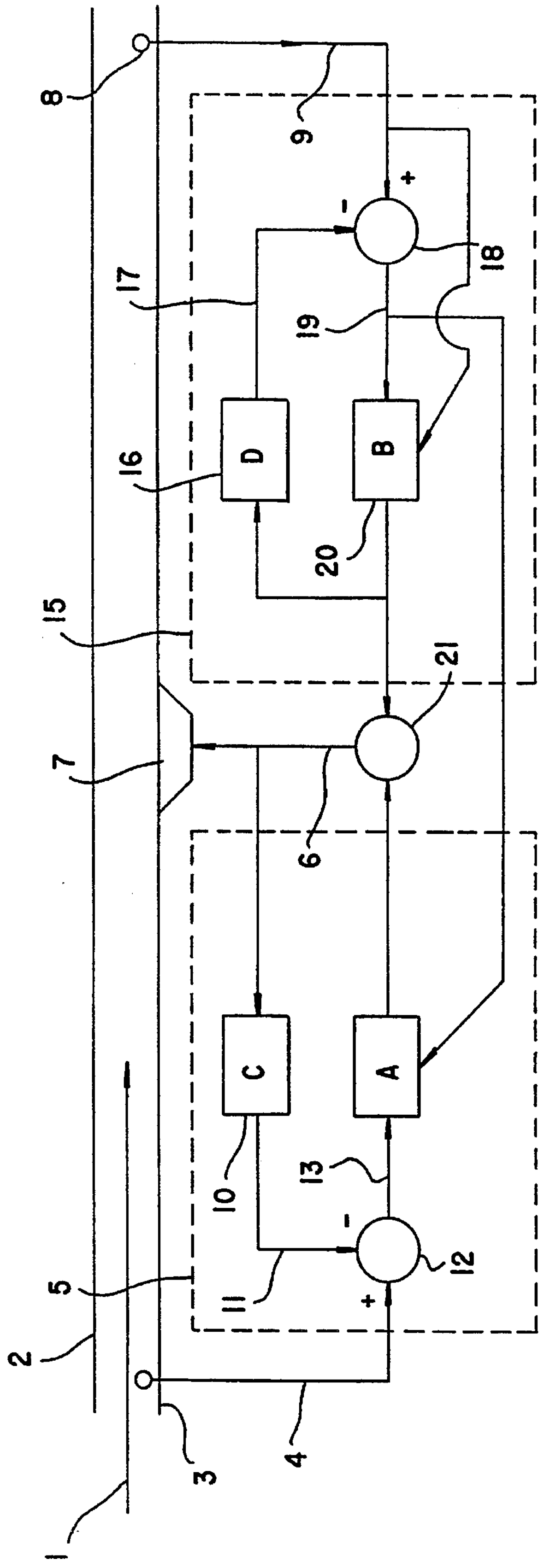
FIG. 5 is a diagrammatic view of another embodiment of a combined feedforward and feedback control system of the invention.

This is depicted in FIG. 5. Here the feedback compensation signal (17) is calculated from the output (22) from the feedback cancellation filter (20) rather than the combined output (6). Thus the feedback input signal represents the residual signal resulting from the effect of the feedforward control signal only—it is independent of the output from the feedback controller.

The combined algorithm of this invention can be used for multi-channel systems. The extension of LMS style algorithms to multi-channel control systems is well known. For example, multi-channel feedforward control, using feedback compensation, is described in Nelson & Elliot, Chapter 12. Multi-channel feedback control using feedback compensation is disclosed by Ziegler, 'Multiple Interacting DVE Algorithm', U.S. patent application No. 07/928,471 herein incorporated by reference. The extension of the current invention from the single channel described above to multiple reference inputs, multiple actuators and multiple residual sensors will be obvious to those skilled in the art.

The basic equations for a system implemented using FIR filters are $$xf_i(n) = uf_i(n) - Cy_i(n),\ i = 1 \ldots nI \quad (14)$$

$$xb_j(n) = ub_j(n) - Dy_j(n),\ j = 1 \ldots nJ \quad (15)$$

$$yf_k(n) = \sum_{i=1}^{nI} \sum_{m=0}^{nA-1} A_{ki}(m) \cdot xf_i(n-m),\ k = 1 \ldots nK \quad (16)$$

$$yb_k(n) = \sum_{j=1}^{nJ} \sum_{m=0}^{nB-1} B_{kj}(m) \cdot xb_j(n-m),\ k = 1 \ldots nK \quad (17)$$

$$y_k(n) = yf_k(n) + yb_k(n),\ k = 1 \ldots nK \quad (18)$$

where nI is the number of reference sensors, nJ is the number of residual sensors and nK is the number of actuators. $A_{kj}$ represents the filter between the jth input and the kth output. Multi-channel versions of B, C and D are similarly defined.

The compensation signals are given by $$Cy_i(n) = \sum_{k=1}^{nK} \sum_{m=0}^{nC-1} C_{ki}(m) \cdot y_k(n-m),\ i = 1 \ldots nI \quad (19)$$

and either $$Dy_j(n) = \sum_{k=1}^{nK} \sum_{m=0}^{nD-1} D_{kj}(m) \cdot y_k(n-m),\ j = 1 \ldots nJ \quad (20)$$

or $$Dy_j(n) = \sum_{k=1}^{nK} \sum_{m=0}^{nD-1} D_{kj}(m) \cdot yb_k(n-m),\ j = 1 \ldots nJ. \quad (21)$$

The multi-channel LMS algorithm for updating these filters is described by Nelson and Elliot (Chapter 12).

EXAMPLE ALGORITHM

In one embodiment of the controller the filters are implemented as Finite Impulse Response (FIR) filters. The parameters are defined in the table below:

| Parameter | Description |
|---|---|
| freq | sampling frequency |
| nA | number of coefficients in forward cancellation filter |
| nB | number of coefficients in backward cancellation filter |
| nC | number of coefficients in forward compensation filter |
| nD | number of coefficients in backward compensation filter |
| gf | forgetting factor for power estimate |
| gb | forgetting factor for power estimate |
| fmin | minimum power |
| bmin | minimum power |
| leak | leakage parameter |
| leakmin | minimum leakage |
| Astep | step size for forward LMS |
| Bstep | step size for backward LMS |
| Cstep | step size for LMS adoption of C filter |
| Dstep | step size for LMS adoption of D filter |
| grb | forgetting factor for residual power estimate |
| gl1 | smoothing factor for leak adjustment |
| gl2 | memory factor for leak adjustment |
| gp | forgetting factor for peak detect |
| level | set level for peak output |
| invlevel | reciprocal of level |
| gmin | minimum test signal level |
| testlevel | test signal level relative to residual level |
| invf | forward normalization factor, (calculated automatically) |
| invb | backward normalization factor, (calculated automatically) |
| gain | gain for test signal level, (calculated automatically) |
| Amu | normalized step size for A filter, (calculated automatically) |
| Bmu | normalized step size for B filter, (calculated automatically) |

The variables, that is the dynamic data in the processor, are defined in the table below.

| Variable Name | Description | Size |
|---|---|---|
| A | FIR forward cancellation filter | nA |
| B | FIR backward cancellation filter | nB |
| C | FIR reference compensation filter | nC |
| D | FIR residual compensation filter | nD |
| uf | reference input signal | 1 |
| ub | residual input signal | 1 |
| test | identification test signal delay line | max(nC + 1, nD + 1) |
| Ctest | compensation for test signal | 1 |
| Dtest | compensation for test signal | 1 |
| rf | compensated reference signal | 1 |
| rb | compensated residual signal | 1 |
| Cy | reference compensation signal | 1 |
| Dy | residual compensation signal | 1 |
| yf | forward control signal | 1 |
| yb | backward control signal | 1 |
| y | control signal delay line | max(nC,nD) |
| output | output signal | 1 |
| xf | forward input signal delay line | max(nA,nD) |
| xb | backward input signal delay line | max(nA,nD) |
| Dxf | filtered forward input signal delay line | nA |
| Dxb | filtered backward input signal delay line | nB |
| pf | forward power estimate | 1 |
| pb | backward power estimate | 1 |
| prb | residual power estimate | 1 |
| peak | peak output level | 1 |

An algorithm for adaptation of the filter coefficients is given below. This describes the $n^{th}$ step of the algorithm and is repeated every sample time. This particular example uses a Normalized Least Mean Square (NLMS) algorithm and includes on-line system identification using a random test signal. The square brackets [. . . ] denote operations that may not be required, but are desirable. The braces {. . . } denote operations that can be done at a reduced rate (i.e. not every sample) or as a background task so as to reduce the processing load on the processor.

read ADCs to get uf(n) and ub(n) (22)

[high pass filter uf and ub] (23)

Comment: Compensate for test signal $$rf(n)=uf(n)-Ctest(n) \quad (24)$$

$$rb(n)=ub(n)-Dtest(n) \quad (25)$$

Comment: Compensate for output signal $$xf(n)=rf(n)-Cy(n) \quad (26)$$

$$xb(n)=rb(n)-Dy(n) \quad (27)$$

Comment: Complete calculation of output $$yf(n)=yf(n)+A(0).xf(n) \quad (28)$$

$$yb(n)=yb(n)+B(0).xb(n) \quad (29)$$

$$y(n)=yf(n)+yb(n) \quad (30)$$

$$output(n)=y(n)+test(n) \quad (31)$$

[high pass filter output] (32)

output to DAC (33)

Comment: Calculate mean modulus of inputs signals $$pf_n=pf_{n-1}+gf.(|Dxf(n-1)|-pf_{n-1}) \quad (34)$$

$$pb_n=pb_{n-1}+gb.(|Dxb(n-1)|-pb_{n-1}) \quad (35)$$

$$\{invf=1/(pf_n+fmin)\} \quad (36)$$

$$\{Amu=Astep.invf.invf\} \quad (37)$$

$$\{invb=1/(pb_n+bmin)\} \quad (38)$$

$$\{Bmu=Bstep.invb.invb\} \quad (39)$$

Comment: Regulate peak output signal (calculate new leak)

$$peak_n=(1-gp).peak_{n-1} \quad (40)$$

if $|y(n)|>peak_n$ then $peak_n=|y(n)|$ end (41)

(42)

$$\left\{\begin{array}{l} \text{if } peak_n > \text{level then} \\ \quad \text{leak} = \text{leak} + gl1 \cdot (1 + \text{leak}) \cdot (peak_n \cdot \text{invlevel} - 1) \\ \text{else} \\ \quad \text{leak} = gl2 \cdot \text{leak} \\ \text{end} \end{array}\right\}$$

(43)

$$\left\{\begin{array}{l} \text{if leak} < \text{leakmin} \\ \quad \text{leak} = \text{leakmin} \\ \text{endif} \end{array}\right\}$$

$$\{Ascale=1-leak.Amu\} \quad (44)$$

$$\{Bscale=1-leak.Bmu\} \quad (45)$$

Comment: Update filters $$factor=Amu.rb(n) \quad (46)$$

$$A_n(m)=Ascale.A_{n-1}(m)-factor.Dxf(n-m),m=0,A-1 \quad (47)$$

$$factor=Bmu.rb(n) \quad (48)$$

$$B_n(m)=Bscale.B_{n-1}(m)-factor.Dxb(n-m),m=0,nB-1 \quad (49)$$

$$factor=-Cstep.rf(n) \quad (50)$$

$$C_n(m)=C_{n-1}(m)-factor.test(n-1-m),m=0,nC-1 \quad (51)$$

$$factor=-Dstep.rb(n) \quad (52)$$

$$D_n(m)=D_{n-1}(m)-factor.test(n-1-m),m=0,nD-1 \quad (53)$$

Comment: Calculate filtered inputs $$Dxf(n) = \sum_{m=0}^{nD-1} D(m) \cdot xf(n-m) \quad (54)$$

$$Dxb(n) = \sum_{m=0}^{nD-1} D(m) \cdot xb(n-m) \quad (55)$$

Comment: Calculate compensation signals for next iteration $$Ctest(n+1) = \sum_{m=0}^{nC-1} C(m) \cdot test(n-m) \quad (56)$$

$$Dtest(n+1) = \sum_{m=0}^{nD-1} D(m) \cdot test(n-m) \quad (57)$$

$$Cy(n+1) = \sum_{m=0}^{nC-1} C(m) \cdot y(n-m) \quad (58)$$

$$Dy(n+1) = \sum_{m=0}^{nD-1} D(m) \cdot y(n-m) \quad (59)$$

Comment: Calculate partial sums :for next iteration $$yf(n+1) = \sum_{m=1}^{nA-1} A(m) \cdot xf(n+1-m) \quad (60)$$

$$yb(n+1) = \sum_{m=1}^{nB-1} B(m) \cdot xb(n+1-m) \quad (61)$$

Comment: Calculate mean modulus of residual signal $$prb_n=prb_{n-1}+grb.(|rb(n)|-prb_{n-1}) \quad (62)$$

Comment: Calculate test signal gain $$\{gain=gmin+testlevel.prb_n\} \quad (63)$$

get new test signal, random(n+1) (64)

$$test(n+1)=random(n+1).gain \quad (65)$$

There are a great many applications for the known feedforward adaptive filter. Since all of these use both a reference sensor and a residual sensor, the feedforward controller can be replaced by a combined feedforward and feedback controller of the current invention. These applications are not necessarily restricted to the control of noise or vibration.

One application area is for reducing noise propagated down ducts or pipes. Here the reference sensor is usually in the pipe upstream (relative to the sound propagation) of the actuator. The actuator is often one or more loudspeakers which can be placed in the pipe or adjacent to the end of the pipe. The main reason for placing the actuator adjacent to the end of the pipe is to remove the actuator from the gases or liquids in the pipe—since these may be hot or corrosive and may be damaging to the actuator. A further advantage is that the feedback from the actuator to the upstream sensor is reduced and may sometimes be neglected. This can simplify the control system by removing the need for the reference compensation filter.

Figure 6:
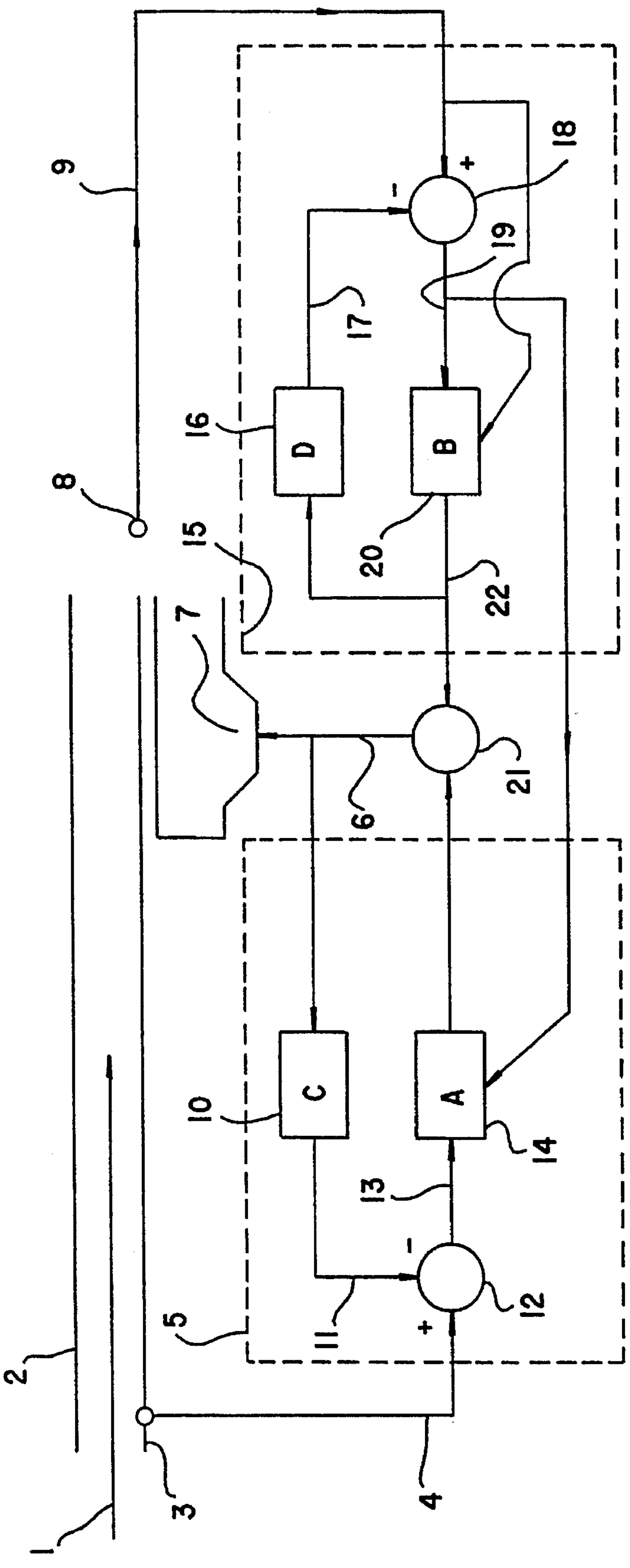
FIG. 6 is a diagrammatic view of the application of the current invention to a muffler noise control system.

The control system has been successfully tested for canceling the noise from an automobile muffler. The general arrangement is shown in FIG. 6. The exhaust gases and noise (1) propagate down the exhaust pipe (2) towards the open end. The upstream sensor (3) was a microphone, the actuators were loudspeakers in an enclosure (7) adjacent to the end of the muffler pipe. The residual sensor (8) was a microphone placed adjacent to the end of the pipe. The control system used FIR filters and a sampling rate of 2 KHz. The resulting noise reduction was approximately 10 dB under transient driving conditions and 20 dB during steady driving conditions. This was better than using a feedforward or feedback controller alone. Further details are described in a co-pending patent application. Another application is in an active ear defender. Here the actuator is a loudspeaker adjacent to the ear or within the ear canal. The residual sensor is placed between the loudspeaker and the ear drum and the reference sensor is placed on the outside of the loudspeaker enclosure or at a nearby position. Adaptive feedforward control has been disclosed for use with ear defenders of this type. Combined feedforward and feedback control provides improved performance.

Having described the invention it will be obvious to those of ordinary skill in the art that many changes and modifications can be made without departing from the scope of the appended claims.

I claim:

1. A control system for controlling a continuing base disturbance, said system comprising a first sensor means for providing a reference signal related to said disturbance, a second sensor means for providing a residual signal related to a combination of the base disturbance and a controlling disturbance, a first subtraction means for subtracting a first compensation signal from said reference signal to produce a first input signal, a first filter means responsive to said first input signal to produce a first output signal, a second subtraction means for subtracting a second compensation signal from said residual signal to produce a second input signal, a second filter means responsive to said second input signal to produce a second output signal, combining means for combining said first and second output signals to produce a control signal, and actuator means adapted to respond to said control signal and to produce said controlling disturbance to thereby control said base sound or vibration disturbance by continually controlling it.

2. The system of claim 1 wherein said first compensation signal is derived by filtering said control signal.

3. The system of claim 1 wherein said second compensation signal is derived by filtering said control signal.

4. The system of claim 1 wherein said second compensation signal is derived by filtering said second output signal.

5. The system of claim 1 wherein said first filter means is an adaptive filter.

6. The system of claim 5 wherein a characteristic of said first filter means is adapted in response to said residual signal.

7. The system of claim 5 wherein a characteristic of said first filter means is adapted in response to said second input signal.

8. The system of claim 1 wherein said second filter means is an adaptive filter.

9. The system of claim 8 wherein a characteristic of said second filter means is adapted in response to said residual signal.

10. The system of claim 8 wherein the adaption is based on a Least Mean Square algorithm.

11. The system of claim 1 wherein said filter means are digital Finite Impulse Response filters.

12. The system of claim 1 wherein said filter means are digital Recursive filters.

13. The system of claim 1, and including means for on-line system identification.

14. A control system with multiple interacting channels for controlling a continuing disturbance, said system comprising first sensor means to provide reference signals related to said disturbance, second sensor means to provide residual signals related to a combination of said continuing disturbance and a controlling disturbance, first subtraction means for subtracting first compensation signals from said reference signals to produce first input signals, first filter means responsive to said first input signals to produce first output signals, second subtraction means for subtracting second compensating signals from said residual signals to produce second input signals, second filter means responsive to said second input signals to produce second output signals, combining means for combining said first and second output signals to produce control signals, and actuator means adapted to respond to said control signals and to produce said control disturbances to thereby control said continuing disturbance.

15. The system of claim 14 wherein said first compensation signals are derived by filtering said control signals.

16. The system of claim 14 wherein said second compensation signals are derived by filtering said control signals.

17. The system of claim 14 wherein said second compensation signals are derived by filtering said second output signals.

18. The system of claim 14 wherein said first filter means are adaptive filters.

19. The system of claim 18 wherein a characteristic of each said first filter means is adapted in response to said residual signals.

20. The system of claim 18 wherein a characteristic of said first filter means is adapted in response to said second input signals.

21. The system of claim 14 wherein a characteristic of each said second filter means is adapted in response to said residual signals.

22. The system of claim 21 wherein said adaption is based on a Least Mean Square algorithm.

23. The system of claim 14 wherein said filter means are digital Finite Impulse Response filters.

24. The system of claim 14 wherein said filter means are digital Recursive filters.

25. The system of claim 14 and including means for on-line identification.

* * * * *